United States Patent [19]
Adler et al.

[11] Patent Number: 5,601,484
[45] Date of Patent: Feb. 11, 1997

[54] DEVICE FOR TRANSPORTING WAFER MAGAZINES

[75] Inventors: Erich Adler; Marlies Mages, both of Jena, Germany

[73] Assignee: Jenoptik GmbH, Jena, Germany

[21] Appl. No.: 406,976

[22] PCT Filed: Jul. 25, 1994

[86] PCT No.: PCT/EP94/02447

§ 371 Date: Apr. 3, 1995

§ 102(e) Date: Apr. 3, 1995

[87] PCT Pub. No.: WO95/05003

PCT Pub. Date: Feb. 16, 1995

[30] Foreign Application Priority Data

Aug. 5, 1993 [DE] Germany ............. 43 26 309.7

[51] Int. Cl.$^6$ ............................................. F24F 3/16
[52] U.S. Cl. ............... 454/187; 414/222; 414/225
[58] Field of Search ....................... 454/56, 57, 187; 414/222, 225, 226

[56] References Cited

U.S. PATENT DOCUMENTS

| | | | |
|---|---|---|---|
| 4,676,144 | 6/1987 | Smith, III | 454/187 |
| 4,917,004 | 4/1990 | Okamoto et al. | 454/187 |
| 5,002,455 | 3/1991 | Kuriyama et al. | 454/187 X |
| 5,413,527 | 5/1995 | Dansui et al. | 454/187 X |
| 5,431,600 | 7/1995 | Murata et al. | 454/187 |

FOREIGN PATENT DOCUMENTS

| | | |
|---|---|---|
| 0340345 | 11/1989 | European Pat. Off. . |
| 0552756 | 7/1993 | European Pat. Off. . |

OTHER PUBLICATIONS

Patent Abstract of Japan, vol. 16, No. 397 (E–1525) 24 Aug. 1992, (JP 4–130 617 1 May 1992 [Ulvac Japan Ltd.]).

*Primary Examiner*—Harold Joyce
*Attorney, Agent, or Firm*— McAulay Fisher Nissen Goldberg & Kiel, LLP

[57] ABSTRACT

In order to transfer a magazine from a depositing position to a processing station, a linear drive for a rigid gripper arm is attached to a supporting column, an air passage opening being formed by the space between the supporting column and an elevator drive, this linear drive being vertically adjustable in the movement direction of the elevator. The range of action of the gripper arm is located above the magazine in the depositing position and is directed vertically to the movement direction of the elevator. All drive parts are separated from the clean room by a dust-tight enclosure and suction devices are arranged adjacent to openings through which the transport elements project into the clean room.

18 Claims, 7 Drawing Sheets

DEVICE FOR TRANSPORTING WAFER MAGAZINES

BACKGROUND OF THE INVENTION a) Field of the Invention

The invention is directed to a device for transporting wafer magazines by means of an elevator between an upper removal position in which the magazine is removed from a magazine container and a lower depositing position from which transfer is carried out to at least one processing location.

b) Description of the Related Art

Systems which have become known as SMIF (Standard Mechanical Interface) systems and are favored in the fabrication of semiconductor chips contain a so-called SMIF box as a magazine container with a relatively small enclosed volume in which wafer magazines can be stored and transported. The box can be placed on an opening mechanism in an enclosure surrounding one or more work stations so as to protect them from dust. The box and opening mechanism have closing elements which are adapted to one another and can be opened simultaneously one above the other so that dust particles which have settled on the outside of the closing elements can be trapped between them when the wafer magazine is lowered into the enclosure together with the two closing elements. The box itself surrounds the opening made in the enclosure.

After the magazine has been deposited, it is generally necessary to effect a transfer within the enclosure. Various technical solutions are known to carry out such transfer.

For example, in EP 209 660 a cassette is transported from a SMIF elevator to a device elevator by an automated cassette manipulator in that a swiveling movement is effected during the vertical movement for lifting or lowering the cassette. The use of rotating members is intended to reduce the degree of particle generation compared with linearly moving members.

Similar solutions are also described in EP 238 541, in which the magazine is transferred along given movement curves by motor-operated lever arms which are moved in the Z-direction by means of a separate lift.

The laminar flow of air required to maintain the clean room is critically disturbed or prevented due to the mechanical construction in the known solutions, in particular due to the fact that the working range of the transfer device which is constructed as a lever arm occurs laterally to the magazine and as a result of the closed construction. Coupling the transfer movement with the Z-movement unnecessarily prolongs transport times and increases particle generation.

Particularly when retrofitting machinery for semiconductor processing, it is difficult in the known technical solutions to supplement already existing clean rooms with the SMIF system so as to allow wafer magazines to be introduced into the primary machines under SMIF conditions and unpacked and transported in the machines under clean room conditions.

OBJECT AND SUMMARY OF THE INVENTION

Therefore, the primary object of the present invention is to eliminate as far as possible particle generation which may be caused by manipulation and to prevent disruption of the laminar flow of air in the clean room caused by the manipulating device, also for a solution in which the manipulating device must act along two regions which can be separated from one another or combined optionally.

According to the invention, this object is met by a device for transporting wafer magazines between an upper removal position and a lower depositing position from which the wafer magazines are transferred to a processing station, these wafer magazines being deposited in a magazine container on a releasable bottom and, together with a closing element of a holding plate, form a transport object for an elevator formed of an elevator drive and holding member in that, for the purpose of transferring the magazine, a linear drive for a rigid gripper arm is attached to a supporting column, an air passage opening being formed by the space between the supporting column and an elevator drive, this linear drive being vertically adjustable in the movement direction of the elevator, the range of action of the gripper arm is located above the magazine in the depositing position and is directed vertically to the movement direction of the elevator. The linear drive, elevator drive and a drive for gripping elements of the gripper arm are separated from the clean room by a dust-tight enclosure and suction devices or extractors are arranged adjacent to openings through which the gripper, its gripping elements and the member holding the transport objects project into the clean room.

The essential features of the invention permit a modular construction of the device so as to ensure that it can be adapted to semiconductor processing machines which are to be outfitted with such a device.

In order to position wafer-like objects protruding from the magazine, a wafer returning device is provided whose actuation is contingent upon a sensor signal of an impact sensor whose bundle of measurement rays is directed parallel to the wafer-shaped objects and is directly adjacent to the removal and charging side of the magazine when the latter is being moved.

An encapsulated transport space is advantageously formed by an enclosure. The enclosure itself forms an element which can be coupled with a semiconductor processing machine so that a climate within the machine can remain undisturbed to a great extent.

A ventilator-filter unit which is additionally accommodated within the enclosure generates a laminar flow of air which is directed either vertically or parallel to the movement direction of the linear drive.

It is also possible to use the device which generates the climate within the interior of the machine.

The invention is explained more fully in the following with reference to the schematic drawing.

DESCRIPTION OF THE PREFERRED EMBODIMENTS

Figure 1:
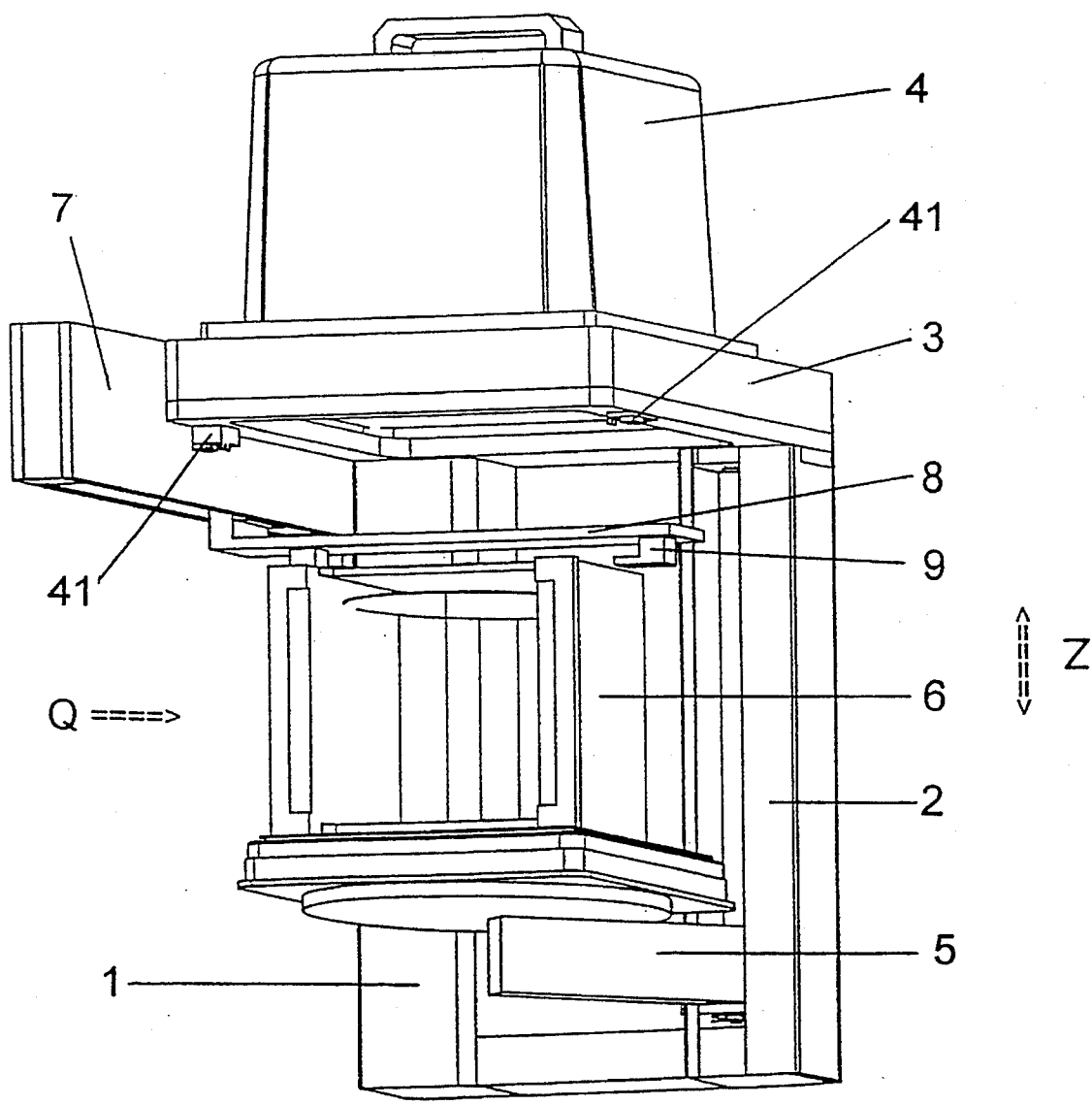
FIG. 1 shows an overall view of a device according to the invention from the front.

In FIG. 1 a supporting column 1 and a covered elevator drive 2 of an elevator serve as supporting members for a holding plate 3 upon which a magazine container 4 with a releasable bottom is deposited, the spacing between the column 1 and elevator drive 2 forming an air passage. A holding arm 5 which can be moved in the Z-direction by the elevator drive 2 is provided for removing and replacing a magazine 6 for wafer-like objects which is located in the magazine container 4. A linear drive 7 for a rigid gripper arm 8 is fastened to the supporting column 1. The effective operating region of the gripper arm 8, as shown in FIG. 1, lies above the magazine 6 located in a lower depositing position and is directed vertically to the movement direction of the elevator drive 2. The gripper arm 8 is provided with gripping elements 9 which are vertically adjustable (in the Z direction) for carrying out the gripping function together with the linear drive 7.

Control elements (not shown) for the linear drive 7 and its lifting function and for the gripper arm 8, including its gripping elements 9, and an extractor or suction device are accommodated in a connection 10 (FIG. 2) formed between the column 1 and elevator drive 2 and in the lower portion of the column 1.

Further, a mechanical interface (not shown) for adapting to a machine to which the device is to be connected is located below the column 1 and elevator drive 2. Operating elements and display elements are arranged in the region of the holding plate 3. External control electronics have a cable connection to the device.

Figure 2:
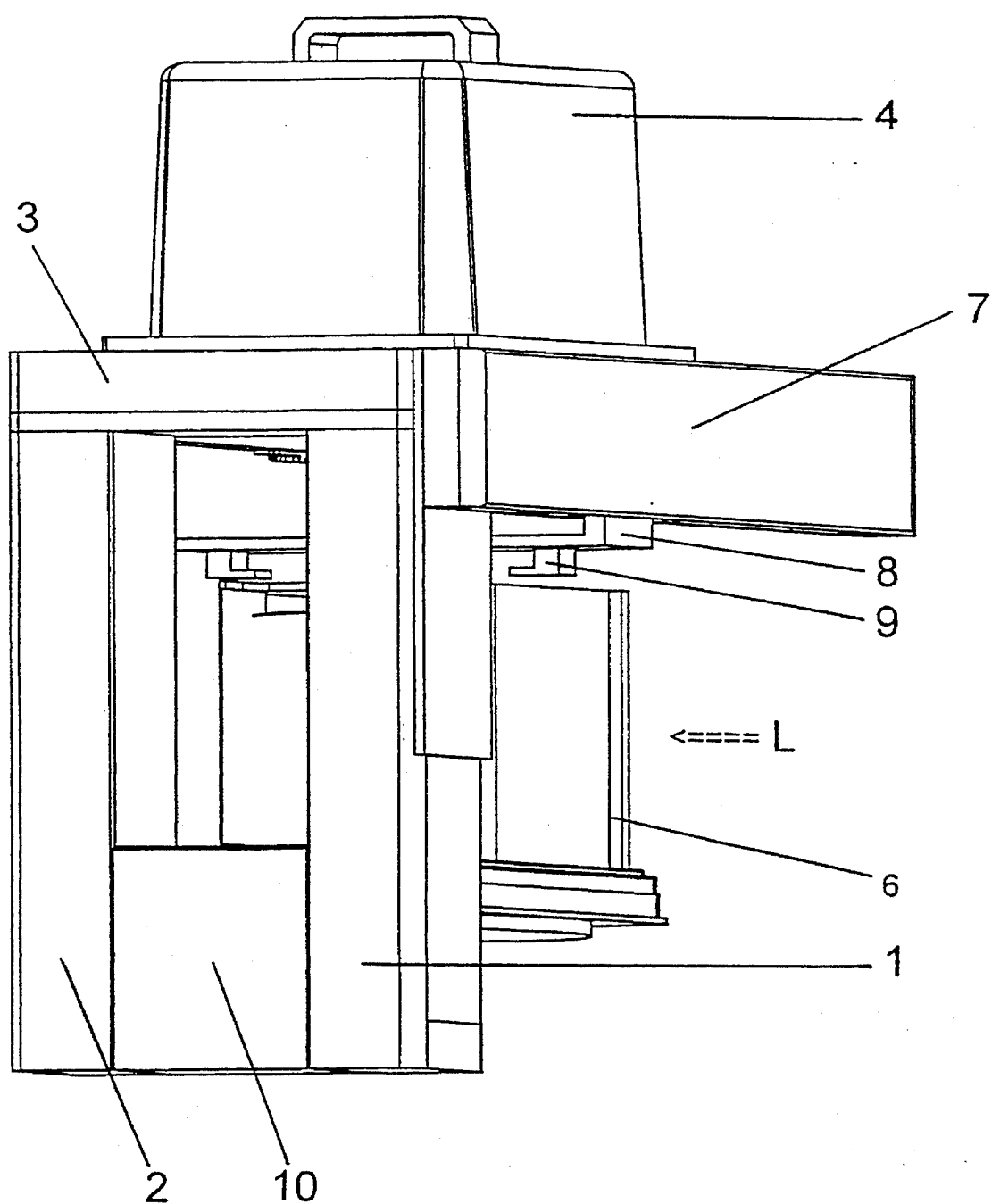
FIG. 2 shows the device from the rear.
Figure 3:
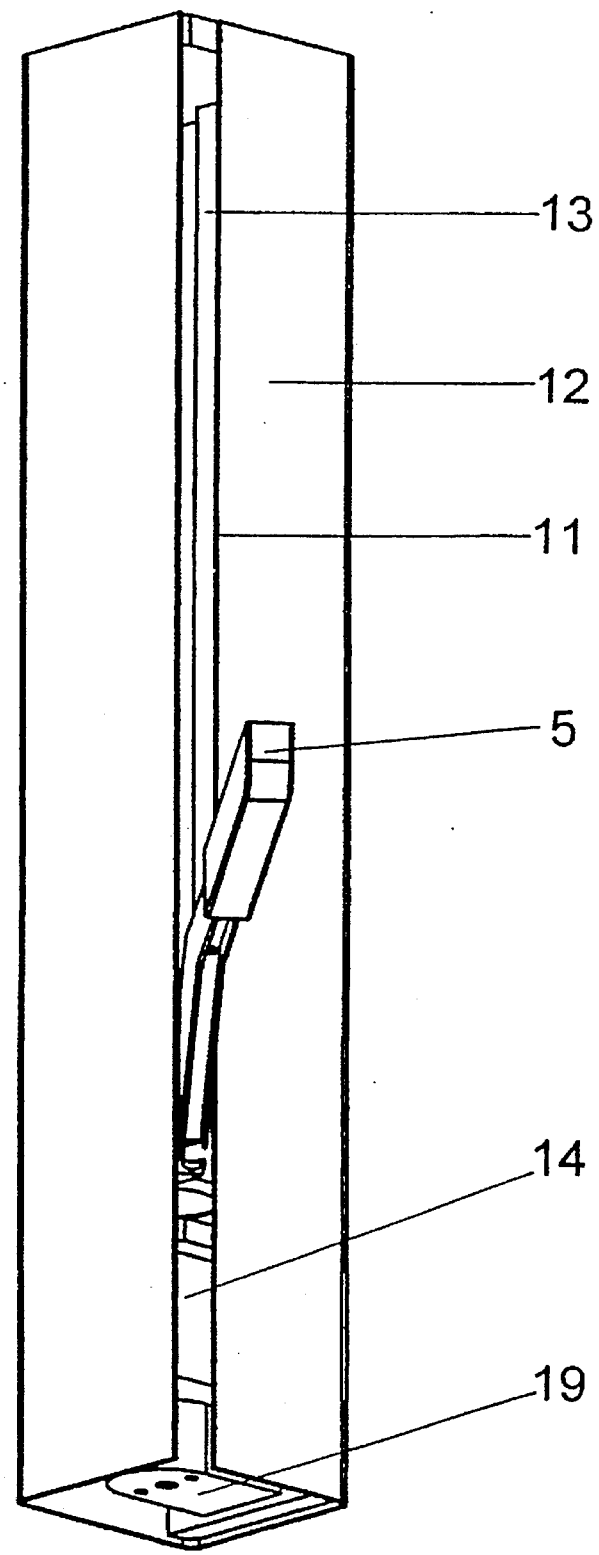
FIG. 3 shows an elevator with covering.
Figure 4:
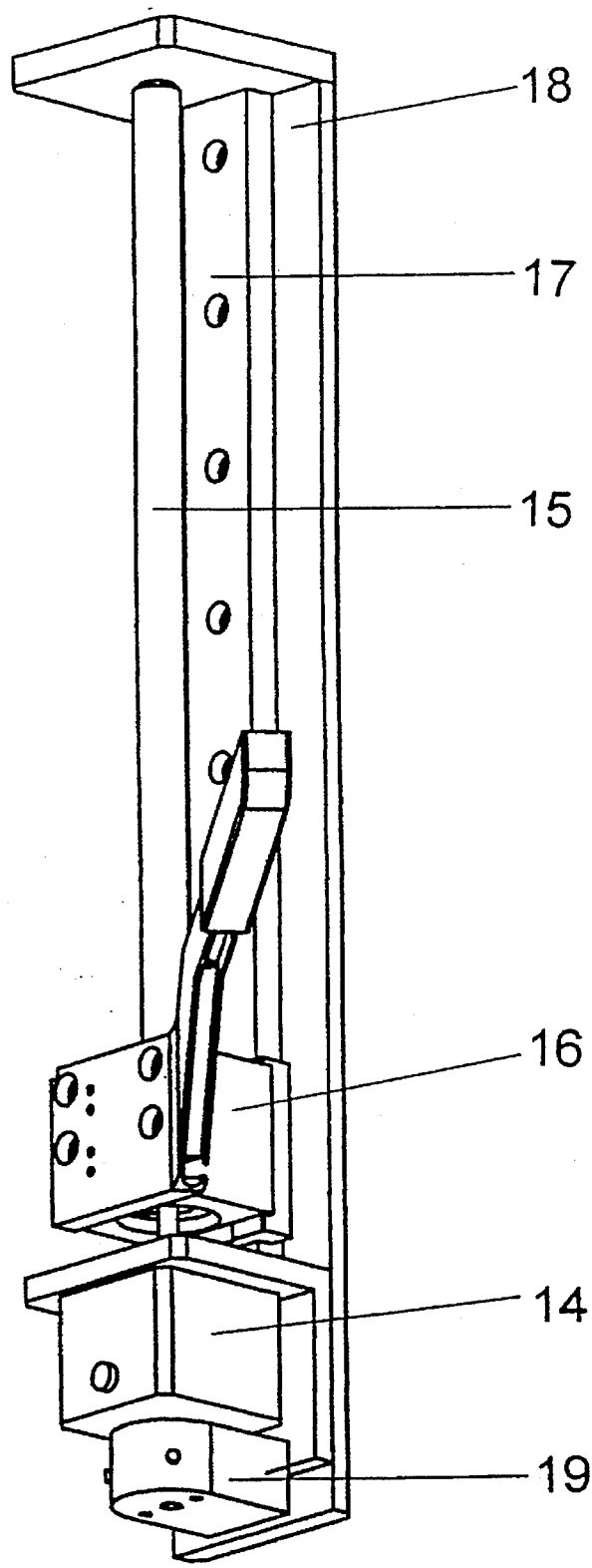
FIG. 4 shows an elevator without covering.

The device in its entirety, as shown in FIGS. 1 and 2, is formed of individual modules such as the elevator drive 2, the holding plate 3 for the magazine container 4, the linear drive 7 with the gripper arm 8 and gripping elements 9, and sensors for detection and safety purposes which can be connected with one another depending on the conditions of use while retaining the essential features of the device.

A laminar flow of air or gas can pass through the magazine 6 in the directions indicated by arrows L and Q without this flow being perturbed by obstructing structural component parts.

Figure 7:
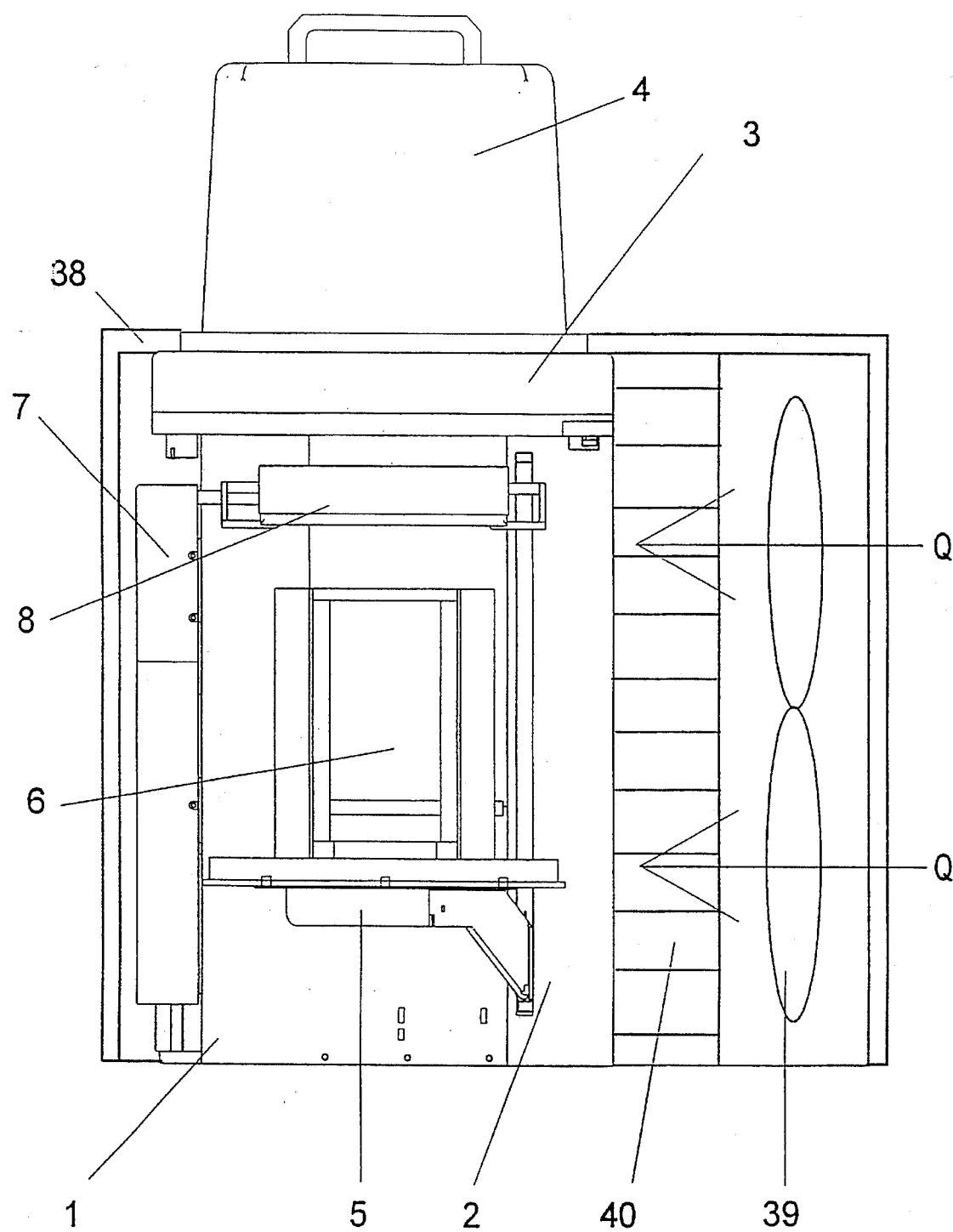
FIG. 7 shows the device with surrounding housing.

With the exception of a slot-like, opening 11 through which the holding arm projects, the elevator drive 2 is entirely enclosed by a covering 12 constructed as a capsule. A suction device 13 in the form of a profiled hollow members extends along the entire length of the openings 11 at both sides of the latter. The profiled hollow members are connected with a vacuum generating device which always only sucks out just enough gas so that the laminar flow of air in the interior, as shown in FIG. 7, for instance, is not disrupted but generated particles are sucked out.

Within the covering 12, the elevator drive 2 is formed of a spindle 15 which is driven by a motor 14. A spindle nut 16 which is coupled with the holding arm 5 runs on the spindle 15 in a guide 17. The guide 17 is mounted on a support 18. The motor 14 has an encoder 19. Sensors (not shown) monitor the upper and lower end positions of the movement region.

Figure 5:
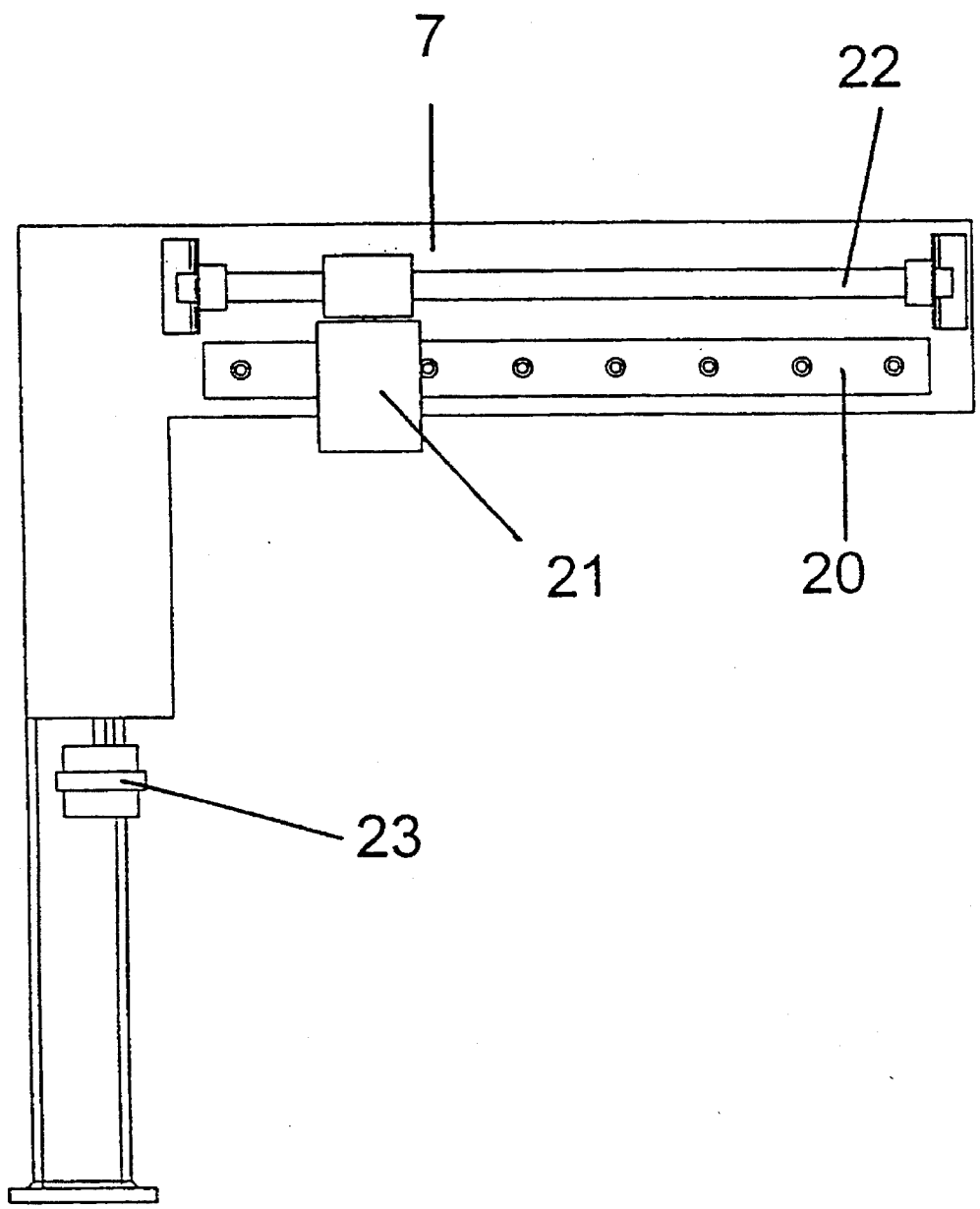
FIG. 5 shows a linear drive without covering.

As shown in FIG. 5, the linear drive 7 contains a guide 20 for a gripper arm fastening 21 of the gripper arm 8 which is connected at the same time with a drive element 22 of the linear drive 7, this guide 20 being mounted in a stationary manner with respect to the frame.

A drive element in the form of a stroke cylinder 23 is arranged in the lower portion of the column 1 for vertical adjustment of the linear drive 7 which is suitably guided in the column 1. The end positions are monitored by sensors.

Figure 6:
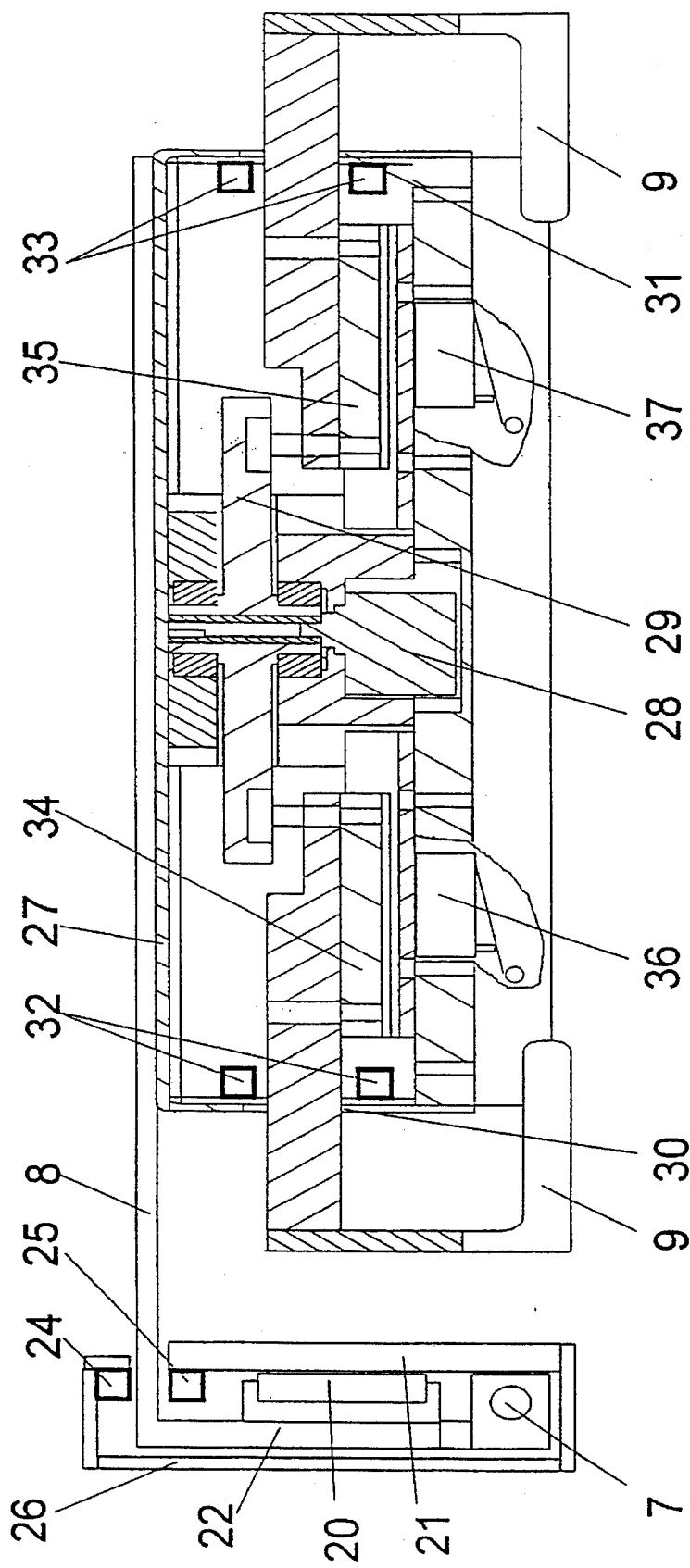
FIG. 6 shows a linear drive with gripper arm and gripping elements in partial section.

The gripper arm 8 fitted at the gripper arm fastening 21 is guided out through a slot in a covering 26. Suction devices, designated by 24 and 25 in FIG. 6, are arranged at both sides of the slot along its entire length in a manner similar to the elevator drive 2.

The gripper arm 8 has, within a housing 27, a drive for the gripping elements 9 which include a motor 28 and a cam disk 29. Suction devices 32, 33 are arranged at outlet openings 30, 31 of the housing 27. The parallel movement of the gripping elements 9 is assisted by miniature guides 34, 35. Limit switches (not shown) monitor the end position of the elements 9 and the position of the gripper is monitored, for instance, by miniature roller switches 36, 37.

In FIG. 7, a ventilator 39 and a filter 40 are accommodated together with the device according to the invention in an enclosure 38 which is produced from a material appropriate for clean room conditions and forms a magazine transfer space. Clean air sucked in through the ventilator 39 is filtered by the clean-room grade filter 40 and passes through the magazine 6.

After the magazine container 4 is deposited on the holding plate 3 and the bottom of the magazine container 4 is unlocked, the device according to the invention moves the magazine 6, together with the bottom and a closing element in the holding plate 3, from an upper removal position to a lower depositing position by means of the elevator. During this process, the gripper arm 8 is located outside of the sphere of movement of the elevator over a processing station.

After the lower depositing position is reached, the gripper arm is moved toward the magazine 6 by the linear drive 7 above the magazine 6. The stroke cylinder 23 lowers the gripper arm 8 with its gripping elements 9. After the miniature roller switches 36, 37 have detected the position of the magazine 6, the gripping elements 9 close and the magazine is lifted via the stroke cylinder. Transport to the processing location is effected by the linear drive 7.

In order to position wafer-like objects protruding from the magazine 6, a wafer returning device is provided whose actuation is contingent upon a sensor signal of an impact sensor 41 whose bundle of measurement rays is directed parallel to the wafer-shaped objects and is directly adjacent to the removal and charging side of the magazine 6 in the Z direction when the latter is being moved.

When triggered by the sensor signal, the wafer returning device guides the wafer-shaped object back into the magazine shelf without external intervention. Without manual intervention, continued transport of the magazine 6 in the transport containers 4 is ensured and damage to protruding wafer-shaped objects is prevented.

While the foregoing description and drawings represent the preferred embodiments of the present invention, it will be obvious to those skilled in the art that various changes and modifications may be made therein without departing from the true spirit and scope of the present invention.

What is claimed is:

1. In a device for use in a clean room for transporting wafer magazines between an upper removal position and a lower depositing position from which the wafer magazines are transferred to at least one processing station, these wafer magazines being deposited in a magazine container on a releasable bottom and, together with a closing element of a holding plate, form a transport object for an elevator formed of an elevator drive and holding member, the improvement comprising:

a rigid gripper arm having gripper elements;

a linear drive for said rigid gripper arm being provided for the purpose of transferring the magazines;

a supporting column to which said linear drive is attached so that an air passage opening is formed by space between the supporting column and said elevator drive;

said linear drive being vertically adjustable in the movement direction of the elevator;

said gripper arm having a range of action located above the magazine in the depositing position and being directed vertically to the movement direction of the elevator;

a dust tight first enclosure for separating said elevator drive from the clear room;

a dust tight second enclosure for separating, from the clean room, a drive for gripping elements of the gripper arm;

first suction devices being arranged adjacent to an opening in said first enclosure through which the holding member for the transport objects projects into the clean room; and second suction devices being arranged adjacent to an opening in said second enclosure through which the gripper arm and its gripping elements project into the clean room.

2. The device according to claim 1, wherein, in order to position wafer-life objects protruding from the magazine prior to a return of the magazine from the lower depositing position to the upper removal position by the elevator drive and the holding member, a wafer returning device is provided whose actuation is responsive to a sensor signal of an impact sensor having a bundle of measurement rays directed parallel to the wafer-shaped objects and directly adjacent to the removal and charging side of the magazine when the magazine is being moved, said impact sensor being fixed relative to said supporting column.

3. The device according to claim 1, including an enclosure as an element for coupling with a semiconductor processing machine.

4. The device according to claim 3, wherein a ventilator-filter unit is additionally accommodated within the enclosure for the purpose of generating a laminar flow of air.

5. The device according to claim 4, wherein the laminar flow of air is directed perpendicularly to the movement direction of the linear drive.

6. The device to claim 4, characterized in that the laminar flow of air is directed parallel to the movement direction of the linear drive.

7. In a device for use in a clean room for transporting wafer magazines between an upper removal position and a lower depositing position from which the wafer magazines are transferred to at least one processing station, these wafer magazines being deposited in a magazine container on a releasable bottom and, together with a closing element of a holding plate, form a transport object for an elevator formed of an elevator drive and holding member, the improvement comprising:

a rigid gripper arm having gripper elements;

a linear drive for said rigid gripper arm being provided for the purpose of transferring the magazines;

a supporting column to which said near drive is attached so that an air passage opening is formed by space between the supporting column and said elevator drive; and said linear drive being vertically adjustable in the movement direction of the elevator.

8. The device according to claim 7, wherein, in order to position wafer-life objects protruding from the magazine prior to to a return of the magazine from the lower depositing position to the upper removal position by the elevator drive and the holding member, a wafer returning device is provided whose actuation is responsive to a sensor signal of an impact sensor having a bundle of measurement rays directed parallel to the wafer-shaped objects and directly adjacent to the removal and charging side of the magazine when the magazine is being moved, said impact sensor being fixed relative to said supporting column.

9. The device according to claim 7, including an enclosure as an element for coupling with a semiconductor processing machine.

10. The device according to claim 9 wherein a ventilator unit is additionally accommodated with the enclosure for the purpose of generating a laminar flow of air.

11. The device according to claim 10 wherein the laminar flow of air is directed perpendicularly to the movement direction of the linear drive.

12. The device according to claim 10 wherein the laminar flow of air is directed parallel to the movement direction of the linear drive.

13. In a device for use in a clean room for transporting wafer magazines between an upper removal position and a lower depositing position from which the wafer magazines are transferred to at least one processing station, these wafer magazines being deposited in a magazine container on a releasable bottom and, together with a closing element of a holding plate, form a transport object for an elevator formed of an elevator drive and holding member, the improvement comprising:

a rigid gripper arm having gripper elements;

a linear drive for said rigid gripper arm being provided for the purpose of transferring the magazines;

a supporting column to which said linear drive is attached so that an air passage opening is formed by space between the supporting column and said elevator drive;

said linear drive being vertically adjustable in the movement direction of the elevator;

said gripper arm having a range of action located above the magazine in the depositing position and being directed vertically to the movement direction of the elevator;

a dust tight first enclosure for separating said elevator drive from the clean room; and a dust tight second enclosure for separating, from the clean room, a drive for gripping elements of the gripper arm.

14. The device according to claim 13, wherein, in order to position wafer-life objects protruding from the magazine prior to to a return of the magazine from the lower depositing position to the upper removal position by the elevator drive and the holding member, a wafer returning device is provided whose actuation is responsive to a sensor signal of an impact sensor having a bundle of measurement rays directed parallel to the wafer-shaped objects and directly adjacent to the removal and charging side of the magazine when the magazine is being moved, said impact sensor being fixed relative to said supporting column.

15. The device according to claim 13, including an enclosure as an element for coupling with a semiconductor processing machine.

16. The device according to claim 15 wherein a ventilator unit is additionally accommodated with the enclosure for the purpose of generating a laminar flow of air.

17. The device according to claim 16 wherein the laminar flow of air is directed perpendicularly to the movement direction of the linear drive.

18. The device according to claim 16 wherein the laminar flow of air is directed parallel to the movement direction of the linear drive.

* * * * *